United States Patent [19]
Dydyk et al.

[11] Patent Number: 6,131,256
[45] Date of Patent: Oct. 17, 2000

[54] TEMPERATURE COMPENSATED RESONATOR AND METHOD

[75] Inventors: Michael Dydyk; John Robert Welling, both of Scottsdale, Ariz.

[73] Assignee: Motorola, Inc., Schaumburg, Ill.

[21] Appl. No.: 08/839,117

[22] Filed: Apr. 23, 1997

Related U.S. Application Data

[62] Division of application No. 08/496,835, Jun. 29, 1995, Pat. No. 5,696,423.

[51] Int. Cl.[7] .................................................. H04R 17/10
[52] U.S. Cl. ............................................. 29/25.35; 29/611
[58] Field of Search ................................. 310/329, 343, 310/346, 348; 29/25.35, 611, 594, 847

[56] References Cited

U.S. PATENT DOCUMENTS

| | | | |
|---|---|---|---|
| 3,171,048 | 2/1965 | Gerber . | |
| 3,201,621 | 8/1965 | Milner | 310/8.9 |
| 3,313,959 | 4/1967 | Dill | 307/88.5 |
| 3,414,832 | 12/1968 | Newell | 330/31 |
| 3,431,392 | 3/1969 | Garland et al. | 219/210 |
| 4,166,967 | 9/1979 | Benes et al. | 310/338 |
| 4,282,498 | 8/1981 | Iizawa | 333/186 |
| 4,443,732 | 4/1984 | Hayashi | 310/343 |
| 4,456,850 | 6/1984 | Inoue et al. | 310/324 |
| 4,502,932 | 3/1985 | Kline et al. | 204/192 |
| 4,556,812 | 12/1985 | Kline et al. | 310/324 |
| 4,616,152 | 10/1986 | Saito et al. | 310/324 |
| 4,640,756 | 2/1987 | Wang et al. | 204/192.18 |
| 4,642,508 | 2/1987 | Suzuki et al. | 310/321 |
| 4,672,591 | 6/1987 | Breimesser et al. | 367/152 |
| 4,719,383 | 1/1988 | Wang et al. | 310/324 |
| 4,725,754 | 2/1988 | Kosinski | 29/25.35 |
| 4,734,608 | 3/1988 | Takoshima | 310/313 R |
| 4,749,900 | 6/1988 | Hadimioglu et al. | 310/334 |
| 4,757,581 | 7/1988 | Yamada et al. | 29/25.35 |
| 4,766,671 | 8/1988 | Utsumi et al. | 29/611 |
| 4,985,687 | 1/1991 | Long | 331/69 |
| 5,011,568 | 4/1991 | Braymen et al. | 156/647 |
| 5,075,641 | 12/1991 | Weber et al. | 331/108 |
| 5,084,694 | 1/1992 | Kikuchi et al. | 29/611 |
| 5,160,870 | 11/1992 | Carson et al. | 310/339 |
| 5,162,691 | 11/1992 | Mariani et al. | 310/321 |

(List continued on next page.)

FOREIGN PATENT DOCUMENTS 5719114   8/1983   Japan .

OTHER PUBLICATIONS

Joel Rosenbaum, Michael G. Price, Rob Bonney and Otis G. Zehl, "Fabrication of Wideband Bragg Cells Using Thermocompression Bonding and Ion Beam Milling", IEEE Transactions, Jan. 1995.

"Face–Mounted Piezoelectric Resonators" by W.E. Newell, Senior Member, IEEE, 1965.

"Performance of Single–Crystal LiNbO$_3$ Transducers Operating Above 1 GHz" by Naoya Uchida, Syuzo Fukunishi and Shoichi Saito from IEEE 1973.

"Fabrication of Wideband Bragg Cells Using Thermocompression Bonding and Ion Beam Milling" by Joel Rosenaum, Michael G. Price, Rob Bonney and Otis G. Zehl, Members of IEEE, from IEEE, 1985.

"Ultrasonically Welded Piezolectric Transducers" by John D. Larson, III and D.K. Winslow, Members of IEEE, from IEEE 1971.

*Primary Examiner*—Lee Young
*Assistant Examiner*—A. Dexter Tugbang
*Attorney, Agent, or Firm*—Frederick M. Fliegel; Frank J. Bogacz; Jeff D. Limon

[57] ABSTRACT

A temperature compensated resonator (15) and method for making the temperature compensated resonator (15). The temperature compensated resonator (15) has a substrate (110) including a cavity (120, 160) and a resonator layer (150). A bonding medium (159, 160) couples the substrate (110) to the resonator layer (150). The resonator layer (150) is bonded atop the cavity (120, 160). A conductor (215) is included on the resonator layer (150). The conductor (215) heats the resonator layer (150) in response to a current passing through the conductor (215).

5 Claims, 3 Drawing Sheets

U.S. PATENT DOCUMENTS

| | | | |
|---|---|---|---|
| 5,165,289 | 11/1992 | Tilmans | 73/862.59 |
| 5,202,692 | 4/1993 | Huguenin et al. | 342/179 |
| 5,373,268 | 12/1994 | Dworsky et al. | 333/187 |
| 5,386,137 | 1/1995 | Dell et al. | 257/458 |
| 5,517,076 | 5/1996 | Takeuchi et al. | 310/358 |
| 5,535,494 | 7/1996 | Plesinger et al. | 29/25.35 |
| 5,569,626 | 10/1996 | Kurtz et al. | 29/25.35 |
| 5,585,957 | 12/1996 | Nakao et al. | 359/248 |
| 5,623,236 | 4/1997 | Yoshinaga et al. | 29/25.35 |
| 5,761,781 | 6/1998 | Teragaki | 29/25.35 |
| 5,774,960 | 7/1998 | De Fraguier et al. | 29/25.35 |

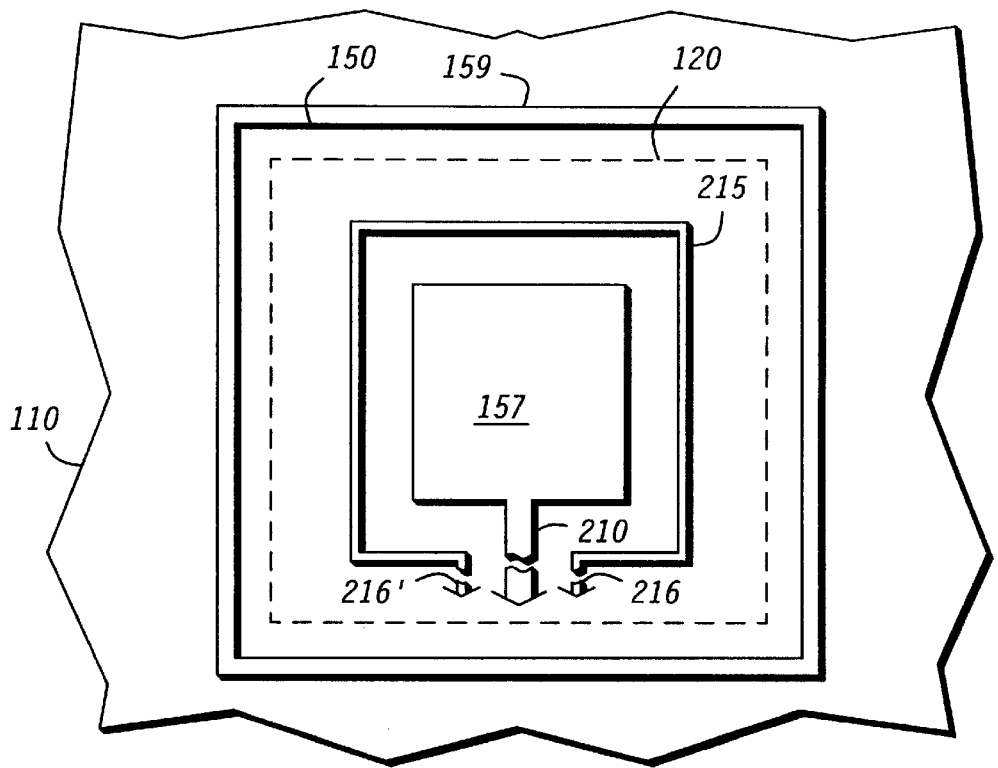
FIG. 3
FIG. 4
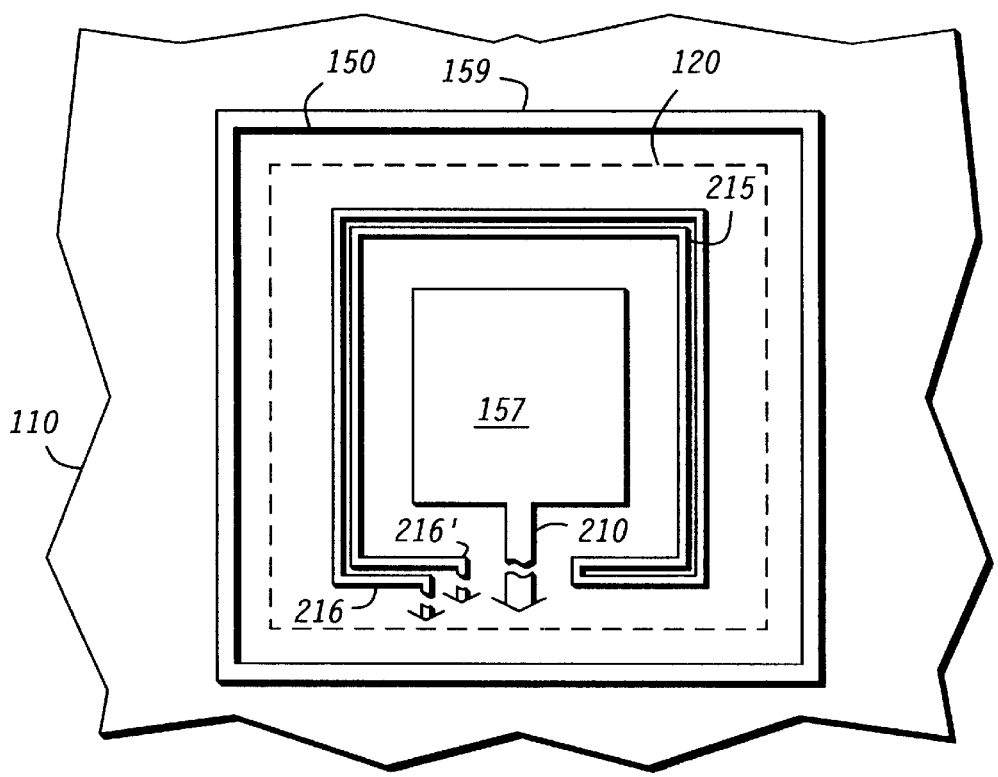

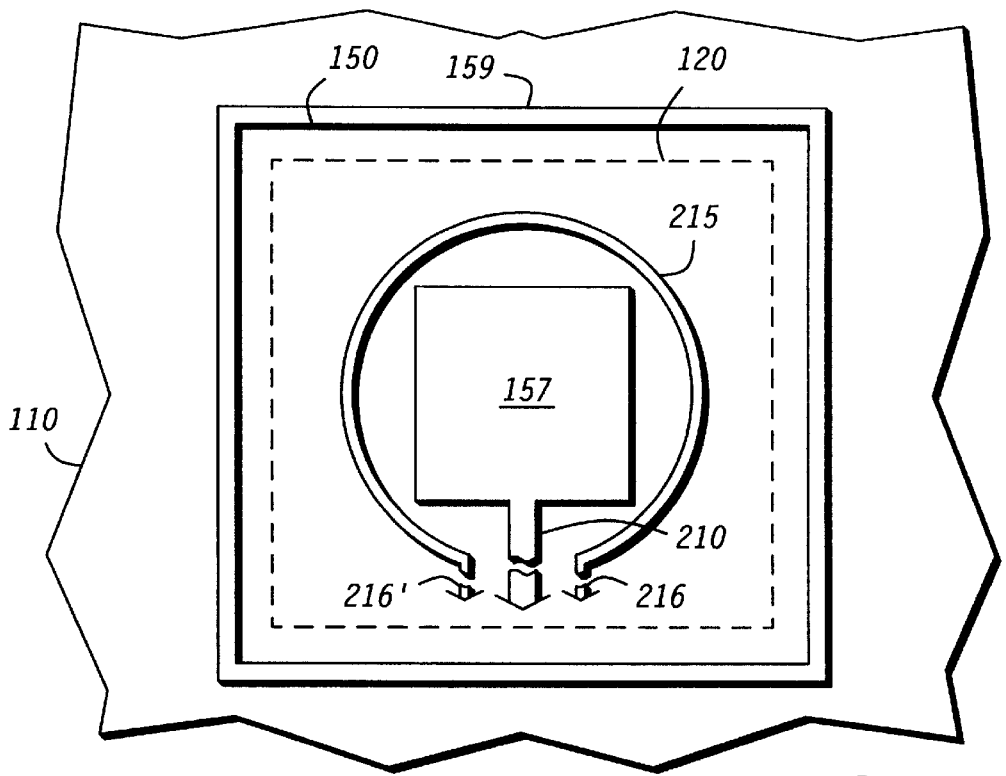
FIG. 5
FIG. 6
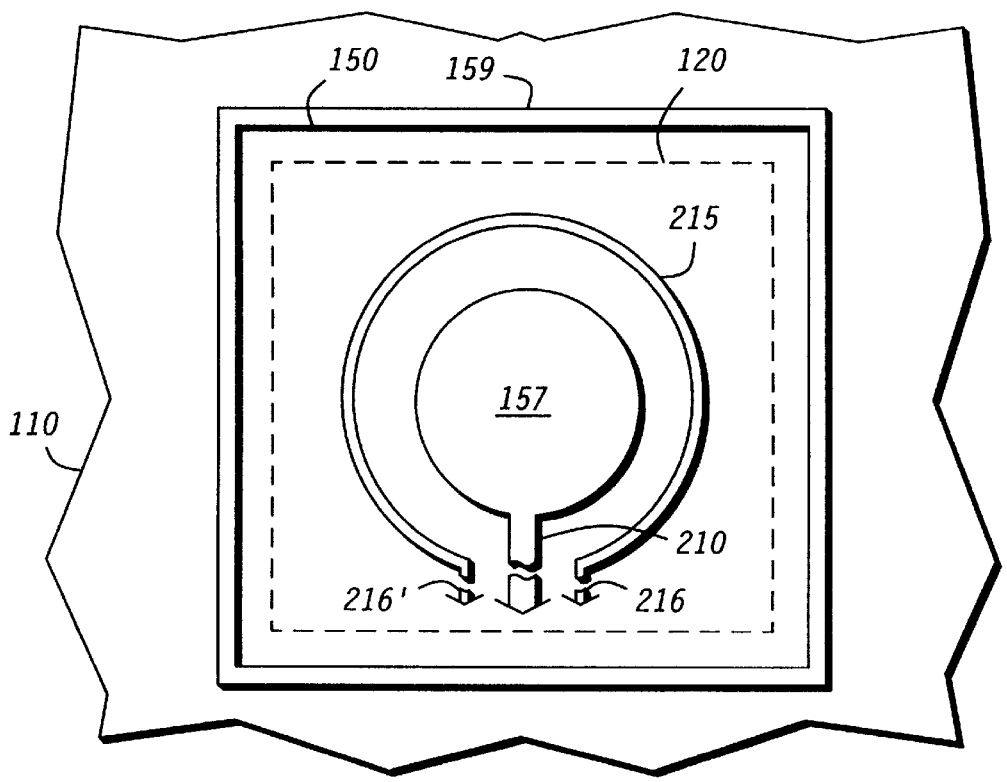

TEMPERATURE COMPENSATED RESONATOR AND METHOD

This is a division of application Ser. No. 08/496,835 filed Jun. 29, 1995, now U.S. Pat. No. 5,696,423.

CROSS-REFERENCE TO RELATED APPLICATIONS

This application is related to co-pending U.S. patent application Ser. Nos. 08/496,837 and 08/496,780, filed on an even date herewith and which are assigned to the same assignee as the present application.

FIELD OF THE INVENTION

This invention relates in general to the field of temperature compensated frequency selection components, in particular to bulk acoustic wave frequency selection components and more particularly to an improved temperature compensation for a bulk acoustic wave frequency selection component.

BACKGROUND OF THE INVENTION

Frequency selective components such as resonators are important for many electronic products requiring stable frequency signals or ability to discriminate between signals based on frequency diversity. These functions are difficult to reliably and repeatably realize in monolithic form together with other microelectronic components such as transistors, diodes and the like.

One approach to realizing frequency selective functions employs a mass allowed to vibrate in one or more dimensions (e.g., a pendulum). Such a mass is conveniently realized as a thin membrane supported at critical points, for example, peripherally or alternatively along one edge or end, forming a thin resonator structure. Such structures provide clearly defined mechanical resonances having significant utility, for example, as filters and as frequency stabilizing feedback elements in oscillator circuits. These structures have the advantages of being extremely compact and of providing narrow bandwidth (i.e., high quality factor) frequency selection components that are light weight and which do not require adjustment over the life of the component.

A significant drawback of previous thin resonators has been the need to fabricate a free-standing thin film membrane. Typically, this is effected by forming a sacrificial layer followed by deposition of the membrane. The sacrificial layer is then selectively removed, leaving a self-supporting layer.

An alternative approach involves forming a cantilevered beam capacitively coupled to adjacent structures (e.g., a conductor placed beneath the beam). The beam is free to vibrate and has one or more resonance frequencies. Disadvantages of these approaches include need to form free-standing structures and also a tendency of the beam to "stick" to adjacent structures if or when the beam comes into contact therewith.

Problems encountered with such devices include temperature sensitivity of the device resulting in temperature-induced shifts in the center frequency of the frequency selection component. Piezoelectric materials having higher electromechanical coupling coefficients (e.g., $LiNbO_3$, $LiTaO_3$, $AlPO_4$, $BiGeO_{20}$, $BiSiO_{20}$ and the like) are preferred for some applications but tend to have larger temperature coefficients and so tend to have frequency selection properties that are more strongly temperature dependent. This is more of a problem for applications requiring closer frequency tolerances because the desired frequency characteristics must be maintained more closely over the operating temperature range.

An additional problem that may occur for some applications is that the Q or quality factor of the material(s) employed in the resonator may preclude providing the required bandwidth and insertion loss in the completed structure. Generally, narrow bandwidths together with low insertion losses require high Q materials. Deposited thin-film layers of piezoelectric materials tend to have poorer (i.e., lower) quality factors than the same materials prepared by other techniques (e.g., single-crystal piezoelectric materials) and this may limit the achievable bandwidth. Additionally, employing lossy materials for electrodes (e.g., Au, Ag, Pb etc.) reduces the overall Q of the resonator structure while use of low acoustic loss materials (e.g., Al and alloys thereof) has less of an impact on the Q of the resonator structure. Accordingly, the bandwidth requirements for some applications may preclude use of some materials in the resonator and require the use of other materials or particular material preparation techniques. The required materials may have temperature characteristics dictating need for temperature stabilization of the overall resonator structure.

Many applications require robust, light-weight devices to be realized in small form factor and to consume as little electrical power as possible while operating over a broad range of temperatures. For example, satellite communications apparatus have stringent power requirements and also must operate over a broad temperature range. This example also places a premium on size, weight and reliability.

What are needed are apparatus and methods for forming apparatus wherein the apparatus provides a thin acoustic resonator having solid mechanical support and including temperature-stable, narrow-bandwidth frequency selection characteristics together with low power consumption requirements.

SUMMARY OF THE INVENTION

A temperature compensated resonator includes a substrate including a cavity, a resonator layer and a bonding medium coupled to the substrate and to the resonator layer. The resonator layer is disposed atop the substrate and the cavity. The resonator also includes a conductor disposed on the resonator layer and surrounding a resonator electrode. The conductor is for heating the resonator layer in response to a current passing through the conductor.

The temperature compensated resonator desirably includes a resonator layer comprising a material chosen from a group consisting of lithium niobate, lithium tantalate, zinc oxide and aluminum nitride. The temperature compensated resonator optionally includes a conductor comprising a circular shape and desirably the substrate comprises a semiconductor substrate including an integrated circuit. The bonding medium desirably but not essentially comprises gold having a thickness in a range of from about one-tenth micrometer to about ten micrometers.

The temperature compensated resonator optionally includes a resonator layer including a first electrode disposed on a first surface of the resonator layer and a second electrode disposed on a second surface of the resonator layer, wherein the first and second surfaces are substantially parallel to each other. In one preferred embodiment, the first and second surfaces are separated by a distance of less than twenty micrometers. The first and second electrodes optionally are disposed such that peripheries of the first and second electrodes substantially align and such that the periphery of the second electrode is contained within boundaries of the cavity. Desirably, one of the first and second electrodes is disposed such that a periphery of the one is contained within boundaries of the cavity. In a preferred embodiment, the resonator layer comprises single-crystal piezoelectric material.

A method for making a temperature compensated frequency selection component comprises steps of providing a substrate including a cavity, providing a resonator layer including a conductor disposed on the resonator layer and bonding the resonator layer to the substrate such that the resonator layer is disposed atop the substrate and the cavity, wherein the conductor is for heating the resonator layer in response to a current passing through the conductor.

The step of providing a substrate including a cavity desirably includes a step of providing a semiconductor substrate. The step of providing a resonator layer optionally includes a step of providing a resonator layer comprising a single-crystal piezoelectric material chosen from a group consisting of lithium niobate and lithium tantalate and having a first thickness in a range of one hundred micrometers to in excess of one millimeter. The step of bonding optionally includes a step of thinning the resonator layer to a second thickness less than the first thickness by a mechanical polishing technique. The step of bonding further optionally includes a step of thinning the resonator layer to a third thickness less than the second thickness via a gas-phase etching process.

The bonding step further desirably includes steps of depositing a metal film on the resonator layer and welding the resonator layer to the substrate by resistance heating of the metal film. Alternatively, the step of bonding optionally further includes steps of depositing a metal film on the resonator layer and welding the resonator layer to the substrate by ultrasonic thermocompression welding the metal film.

A temperature compensated resonator comprises a substrate comprising a semiconductor material and including a cavity, where the substrate includes an integrated circuit and a resonator layer comprising a single-crystal piezoelectric material chosen from a group consisting of lithium niobate and lithium tantalate. The resonator also includes a bonding medium coupled to the substrate and to the resonator layer, whereby the resonator layer is disposed atop the substrate and the cavity, and a conductor disposed on the resonator layer. The conductor is for heating the resonator layer in response to a current passing through the conductor. The resonator layer desirably includes a first electrode disposed on a first surface of the resonator layer and a second electrode disposed on a second surface of the resonator layer, wherein the first and second surfaces are substantially parallel to each other and the first and second surfaces are separated by a distance of less than ten micrometers and wherein one of the first and second electrodes is disposed such that a periphery of the one is contained within boundaries of the cavity.

BRIEF DESCRIPTION OF THE DRAWINGS

FIG. 3 illustrates a simplified plan view of a first embodiment of a temperature compensated resonator in accordance with the present invention;

FIG. 4 illustrates a simplified plan view of a second embodiment of a temperature compensated resonator in accordance with the present invention;

FIG. 5 illustrates a simplified plan view of a second embodiment of a temperature compensated resonator in accordance with the present invention; and FIG. 6 illustrates a simplified plan view of a third embodiment of a temperature compensated resonator in accordance with the present invention.

DETAILED DESCRIPTION OF THE DRAWINGS

Acoustic resonators in accordance with the present invention may be formed in several types of structures. These include a via hole structure and a cavity structure.

I. VIA HOLE STRUCTURE

Figure 1:
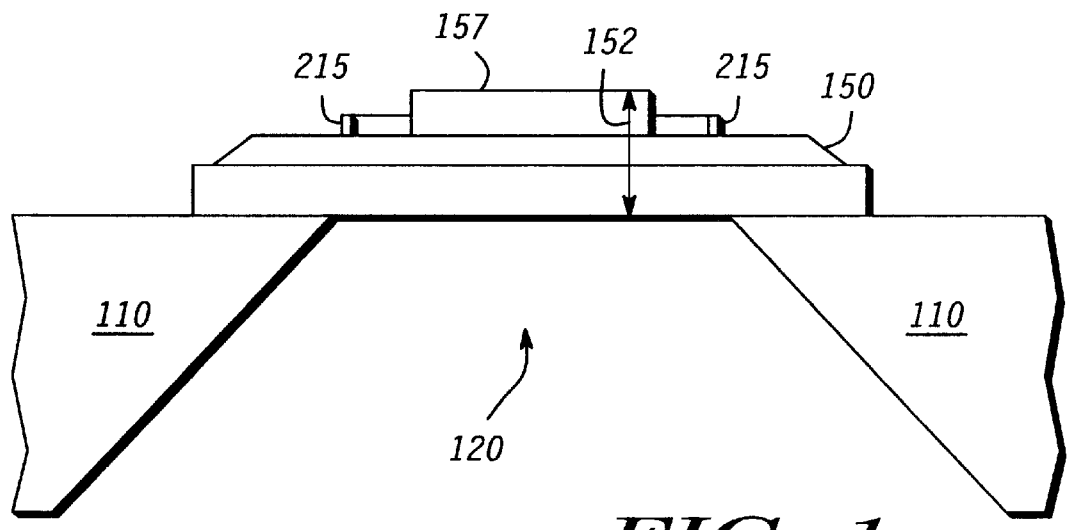
FIG. 1 illustrates a simplified side view, in section, of a first embodiment of an acoustic resonator in accordance with the present invention.

FIG. 1 illustrates a simplified side view, in section, of a first embodiment of acoustic resonator 15 comprising substrate 110 and resonator layer 150 including first and second electrodes 157 and 159 disposed on first and second surfaces of resonator layer 150, respectively, and collectively having thickness 152 in accordance with the present invention. Thickness 152 is typically chosen to be one-half of an acoustic wavelength or an odd multiple thereof. A portion of resonator layer 150 disposed over via or cavity 120 and beneath electrode 157 provides mechanical oscillations that determine the frequency response of temperature compensated acoustic resonator 15. Resonator layer 150 desirably comprises one or more piezoelectric materials.

Substrate 110 provides mechanical support for resonator layer 150 and electrodes 157 and 159 and for any ancillary components such as transistors, diodes, capacitors, resistors and the like included as part of a larger microelectronic device or integrated circuit (not shown). Substrate 110 conveniently comprises a semiconductor substrate or is compatible therewith (e.g., silicon on sapphire, cadmium sulphide on glass etc.). Semiconductor materials presently of particular interest include elemental semiconductors such as diamond, silicon and germanium, germanium silicide, silicon carbide, III–V materials such as gallium arsenide, aluminum nitride, indium phosphide and the like, II–VI materials such as cadmium sulphide, zinc oxide and so forth and alloys such as, by way of example and not intended to be limiting, $Si_xGe_{1-x}$, $Al_xGa_{1-x}As$ and $In_xAl_{1-x}P$. Cubic semiconductors (e.g., Si, Ge, GaAs etc.) are often prepared as wafers having a {100} surface, for example, which surface is polished and otherwise prepared for use as semiconductor device substrates. Other useful orientations include {110} and {111} faces.

An acoustic resonator such as 15 of FIG. 1 including substrate material 110 having layers 150, 157, 159 disposed thereon is etched from the back side to provide an opening 120 extending up to the bottom of the membrane comprising layers 150, 157, 159. This can be accomplished by use of etchants having etch rates sensitive to doping of semiconductor materials 110 coupled with use of a surface layer of material having different doping than the bulk of the material, for example. Other options include employing a surface layer or layers (e.g., layers 150, 157, 159) on substrate 110 of different composition and/or crystallographic form or orientation to provide a layer following etching or other treatment to selectively remove some of material 110 immediately therebelow.

II. CAVITY STRUCTURE

Figure 2:
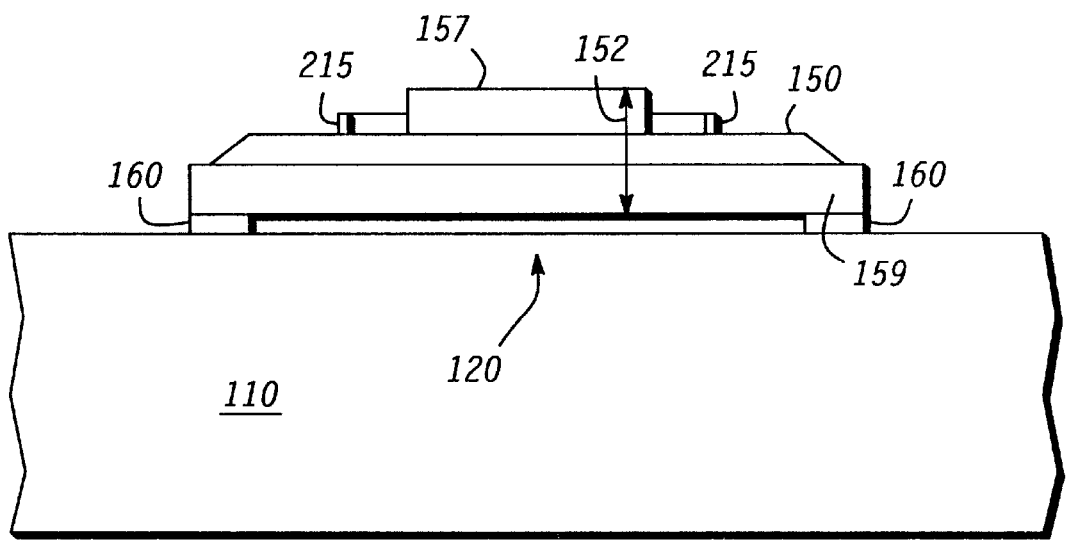
FIG. 2 illustrates a simplified side view, in section, of a second embodiment of an acoustic resonator in accordance with the present invention.

FIG. 2 illustrates a second embodiment of temperature-compensated resonator structure 15 wherein piezoelectric material desirably comprising resonator layer 150 is supported above a surface of substrate 110 by a thin layer of material 160.

A variety of techniques applicable to the acoustic resonator structures 15 of FIGS. 1, 2 are described in U.S. Pat. No. 4,556,812, G. R. Kline et al., "Acoustic Resonator With Al Electrodes On An AlN Layer And Using a GaAs Substrate" (Dec. 3, 1985); U.S. Pat. No. 3,313,959, J. G. Dill, "Thin-Film Resonance Device" (Apr. 11, 1967); U.S. Pat. No. 4,456,850, T. Inoue et al., "Piezoelectric Composite Thin Film Resonator" (Jun. 26, 1984); U.S. Pat. No. 4,502,932, G. R. Kline et al., "Acoustic Resonator And Method Of Making Same" (Mar. 5, 1985); U.S. Pat. No. 4,460,756, J. S. Wang et al., "Method Of Making A Piezoelectric Shear Wave Resonator" (Feb. 3, 1987); U.S. Pat. No. 4,642,508, H. Suzuki et al., "Piezoelectric Resonating Device" (Feb. 10, 1987); U.S. Pat. No. 4,719,383, J. S. Wang et al., "Piezoelectric Shear Wave Resonator And Method Of Making Same" (Jan. 12, 1988); U.S. Pat. No. 5,011,568, S. D. Brayman et al., "Use Of Sol-Gel Derived Tantalum Oxide As A Protective Coating For Etching Silicon" (Apr. 30, 1991); U.S. Pat. No. 5,075,641, R. J. Weber et al., "High Frequency Oscillator Comprising Thin Film Resonator And Active Device" (Dec. 24, 1991); U.S. Pat. No. 5,162,691, E. A. Mariani et al., "Cantilevered Air-Gap Type Thin Film Piezoelectric Resonator" (Nov. 10, 1992); and U.S. Pat. No. 5,373,268, L. N. Dworsky et al., "Thin Film Resonator Having Stacked Acoustic Reflecting Impedance Matching Layers And Method" (Dec. 13, 1994), which patents are hereby incorporated herein by reference.

Temperature compensated resonators 15 of FIGS. 1, 2 preferably employ high quality factor materials. For example, electrodes 157, 159 typically comprise aluminum and are fabricated after selective removal of gold films deposited for attachment of layer 150 to substrate 110 because aluminum has substantially more favorable acoustic properties than gold while gold has substantially more favorable welding properties than aluminum does. Quality factors for a number of materials are provided in Table I below, adapted from "Bulk Acoustic Wave Theory And Devices" by Joel Rosenbaum (Artech House 1988).

TABLE I

Representative acoustic propagation losses and quality factors for several materials at a frequency of one gigahertz (Q scales as one over frequency).

| Material | loss (dB/cm) | Q |
|---|---|---|
| Sapphire | 0.2 | $2 \cdot 10^5$ |
| LiNbO$_3$ | 0.3–0.5 | $1 \cdot 10^5$ |
| LiTaO$_3$ | 0.2 | $2 \cdot 10^5$ |
| TiO$_2$ | 0.4 | $1 \cdot 10^5$ |
| SiO$_2$ (crystalline) | 2 | $2 \cdot 10^4$ |
| SiO$_2$ (fused) | 14 | 2700 |
| GaAs | 30 | 1250 |
| Al | 18 | $2 \cdot 10^3$ |
| Au | 80 | 450 |

III. HEATING ELEMENT

FIG. 3 illustrates a simplified plan view of temperature compensated resonator 15 in accordance with the present invention. Temperature compensated resonator 15 includes electrode 157 disposed on a portion of resonator layer 150 having a periphery that is within the boundaries of via 120, shown in dotted outline in FIG. 3. Electrode 159 is illustrated as covering the entire bottom of resonator layer 150 but need only extend to cover that portion of resonator layer 150 intended to contribute to mechanical oscillation of temperature compensated acoustic resonator 15. In the example illustrated in FIG. 3, electrode 159 is also employed to mechanically affix resonator layer 150 to substrate 110 through a process, for example, of resistive heating (§ IV, infra) or thermosonic bonding (§ V, infra).

FIG. 3 also illustrates transmission line 210 having electrical connection to electrode 157 and extending from electrode 157 to external electrical circuitry (not illustrated). Transmission line 210 is constructed to have a particular characteristic impedance by varying the width of transmission line 210 and taking into account the thickness and the relative dielectric constant of resonator layer 150 and related structures in accordance with principles well known in the electromagnetic arts.

FIG. 3 further illustrates conductor 215 comprising a resistive loop having interconnections 216, 216'. Conductor 215 is heated by current (e.g., DC) introduced via interconnections 216, 216' to maintain resonator layer 150 at a desired predetermined temperature. Generally, this is done in order to reduce or avoid thermally-induced drift of the frequency response of resonator 15. Interconnections 216, 216' and transmission line 210 are routed to provide appropriate electrical connections to each, for example, by including an airbridge or other type of crossover or by making conductor 215 in the shape of a reentrant loop as illustrated in FIG. 4.

It will be appreciated that the structures of conductor 215 illustrated in FIGS. 3, 4 may be realized by disposing the material comprising conductor 215 in other geometric shapes, e.g., in a substantially hexagonal or octagonal shape, or as a circle or the like. Similarly, the shapes of electrodes 159, 157 need not comprise squares as illustrated but may also be other polygonal or curvilinear shapes. Moreover, the shape adopted for electrodes) 157 and/or 159 need not be the same as that of conductor 215, e.g., a square shape may be adopted for electrode 157 while a circular shape may be adopted for conductor 215. Conductor 215 is desirably formed of a material such as TiW, NiCr, Cr etc. having a thickness and linewidth to provide a desired resistance in accordance with a typical prime power requirement of 100 milliwatts in order to maintain a temperature of 100° C.

FIG. 5 illustrates a simplified plan view of a second embodiment of temperature compensated resonator 15 in accordance with the present invention. In the embodiment illustrated in FIG. 5, conductor 215 comprises a circular or oval section of a loop. This configuration avoids thermal gradients that arise as a result of the corners of the square loop shape of conductor 215 as shown in FIG. 4, providing more even heating of the active area (i.e., the area adjacent to and beneath electrode 157).

FIG. 6 illustrates a simplified plan view of a third embodiment of temperature compensated resonator 15 in accordance with the present invention. In the embodiment of FIG. 6, electrode 157 is formed in a circular shape as well as conductor 215. Advantages of this configuration include the even heating of the active area noted in conjunction with FIG. 5 and further an areal savings resulting from the fact that the separation of conductor 215 from electrode 157 is preferably at least five of thicknesses 152. When electrode 157 is formed in the shape of a square, this minimum separation is provided at the corners and greater separations obtain for the remainder, resulting in poorer thermal coupling of conductor 215 to electrode 157 and the active area therebeneath. Rendering both conductor 215 and electrode 157 round allows (i) improved thermal coupling between the two in conjunction with (ii) reduced overall size.

IV. RESISTANCE WELDING ATTACHMENT

Attachment of resonator layer 150 comprising single-crystal materials such as $LiNbO_3$, $LiTaO_3$ and the like may be effectuated via resistance welding, as described in "Fabrication of Wideband Bragg Cells Using Thermocompression Bonding and Ion Beam Milling", J. Rosenbaum et al., IEEE Trans. Son. Ultrason., Vol. SU-32, No. 1, January 1985, which article is hereby incorporated herein by reference. This article describes attachment and subsequent thinning of single-crystal, high coupling coefficient materials. The two surfaces to be bonded are provided with a bonding medium, for example by metallizing by vacuum evaporation to include 0.15 to 0.5 micrometers of silver or gold. A pressure of 2000 to 7000 $lbf/in^2$ (140 to 500 $kg/cm^2$) is applied, and a resistance check provides positive identification of samples lacking intimate contact between the two surfaces to be joined (e.g., because of particulate contamination). A single current pulse (e.g., having an amplitude of tens of amperes and a duration in a range of several tens of milliseconds) is applied to heat the bonding film to 200 to 400° C. The specific current and duration of the pulse are chosen in accordance with the thermal properties of the materials to be joined and thermal design principles.

Following attachment, the single-crystal piezoelectric material is mechanically lapped to a thickness of about 25 micrometers and is subsequently ion milled to a thickness in a range of one to three micrometers. Greater thicknesses may be employed for lower frequency devices.

V. ULTRASONIC THERMOCOMPRESSION WELDING ATTACHMENT

Attachment of single-crystal materials by ultrasonic welding is described in "Performance of Single-Crystal $LiNbO_3$ Transducers Operating Above 1 GHz", by N. Uchida et al., IEEE Trans. Son. Ultrason. Vol. SU-20, No. 3, July 1973 or "Ultrasonically Welded Piezoelectric Transducers", by J. D. Larson III et al., IEEE Trans. Son. Ultrason., Vol. SU-18, No. 3, July 1971, which articles are incorporated herein by reference. These articles describe mounting of single-crystal materials having thicknesses in a range of more than one millimeter to about one hundred micrometers (with mechanical polishing subsequent to welding to reduce the thickness to about six to ten micrometers) using pressures in a range of from 2000 to 4000 $lb/in^2$ (140 to 280 $kg/cm^2$), acoustic powers of less than a watt (18 kHz), temperatures in a range of from 250 to 400° C. and times of from 15 to 120 minutes (Larson et al.) or pressures in a range of 120 $kg/cm^2$, a few watts of ultrasonic energy (15 kHz), temperatures of about 300° C. and a time of about 90 minutes (Uchida et al.).

Subsequent thinning of the mounted resonator may be effected by (i) mechanical lapping to a second thickness and then (ii) sputtering as described by Uchida et al. or Larson et al. to a third thickness.

Criteria for placement of conductive loop 215 of FIGS. 3, 4 relative to electrode 157 and/or transmission line 210 include (i) need to avoid excessive electromagnetic coupling between conductive loop 215 and electrode 157 and/or transmission line 210, (ii) utility in placing conductive loop 215 sufficiently close to electrode 157 to effectuate heating of the active region of resonator layer 150 below electrode 157 and (iii) desirability of placing conductive loop 215 away from structures such as substrate 110 (i.e., within the boundary or periphery of opening 120) (FIGS. 1, 3) or material 160 (FIGS. 2, 4) in order to support heating of acoustic resonator 15 rather than heating of substrate 110.

Typically, spacing conductive loop 215 several thicknesses of resonator layer 150 (i.e., several times distance 152, FIG. 1) and preferably about five such thicknesses away from electrode 157 and/or transmission line 210 is useful. Alternatively, rendering conductive loop 215 of materials having high sheet resistance and/or narrow linewidth acts to reduce effective electromagnetic coupling of conductive loop 215 from electrode 157 and/or transmission line 210 (i.e., satisfies criterion (i) supra).

Alternatively, conductor 215 may be placed immediately adjacent electrode 157 if the transmission line impedance of connections 216, 216' and conductor 215 is chosen to be grossly different that of electrode 157 and/or transmission line 210 and the mechanical properties of conductor 215 do not substantially adversely affect the quality factor of resonator 15. Balancing of criteria (ii) and (iii) is carried out in accordance with the power budget desired for acoustic resonator 15 and employing well-known thermal modeling techniques.

VI. FEEDBACK CIRCUIT FOR SENSING TEMPERATURE OR FREQUENCY DRIFT

Temperature compensation is usefully effected by including a temperature sensor (e.g., thermocouple, thermistor, resistor having known temperature coefficient of resistance etc., not illustrated) on or near acoustic resonator 15 and/or directly coupled to or on resonator layer 150. The temperature sensor is coupled to suitable sensing circuitry (not illustrated), which actuates a control circuit (not illustrated) to supply current to conductor 215 when the temperature of acoustic resonator 15 falls below some predetermined limit and which does not supply current to conductor 215 when the temperature of the temperature sensor equals or exceeds a second predetermined limit. Examples of simple circuits include (i) a FET having conductor 215 as a drain resistor, a grounded source and a thermistor coupled from the gate to ground, with a suitable resistor coupled from the gate to −Vg; (ii) a FET having conductor 215 as a drain resistor, a grounded gate and including a thermistor coupled between the source and ground; (iii) a PNP BJT having a grounded collector, a thermistor coupled from the base to ground and a resistor coupled from the base to Ve and having conductor 215 coupled between the emitter and Ve.

Feedback circuits that sense (and alter the temperature of resonator 15 to correct deviations in) the frequency of operation of resonator 15, rather than the temperature, have the advantage of being able to compensate for long-term drift not directly dependent on temperature that may be present in resonator 15. This may be effected by including a representative one of acoustic resonators 15 in a frequency locked loop (not illustrated) that is coupled to a control circuit that in turn regulates current supplied to conductor 215 to effect the desired frequency shift. Alternatively, a multiplexing circuit (not illustrated) may be employed to switch resonators 15 from normal signal-processing tasks into a frequency-locked loop (not illustrated) or other frequency-measurement apparatus (not illustrated) periodically or aperiodically in order to assess and correct frequency drift from any source.

VII. EXAMPLE

Calculations show that a $LiNbO_3$ (or $LiTaO_3$) resonator layer 150 with a diameter of 240 micrometers and a thickness of 11.45 micrometers, having circular electrodes 157 (diameter 75 micrometers), operating at the $5^{TH}$ harmonic, can maintain a constant temperature over an ambient temperature range of 100° C. using less than 100 milliwatts of prime power. These calculations assumed a resistive ring conductor 215 having a width of ten micrometers separated from electrode 157 by a gap of fifty-five micrometers. Either a GaAs or a Si substrate roughly half a millimeter thick is compatible with this design.

VIII. CONCLUSIONS

It will be appreciated that other arrangements also achieve the advantages and features of the instant invention. For example, in FIGS. 1, 2, electrode 157 is illustrated as having a periphery or outer edge contained within the periphery or inner edge of via or cavity 120 (dashed lines, FIGS. 3, 4). In some embodiments (not illustrated), both of electrodes 157 and 159 have peripheries falling within the periphery of via or cavity 120 (dashed lines, FIGS. 3, 4) and peripheries of electrodes 157, 159 may or may not substantially overlap. In these embodiments, a separate metallization is employed as a bonding medium for securing resonator layer 150 to substrate 110. Of necessity, at least some portion of bonding medium 160 is placed at or outside of the periphery of via or cavity 120 (dashed lines, FIGS. 3, 4). It will be appreciated that corners in conductor 215 cause temperature excursions that may be alleviated by varying the resistance per unit length of conductor 215 and that crossovers may be employed to reduce temperature gradients introduced by interconnections 216, 216'. For example, transmission line 210 may cross over conductor 215 in order to allow interconnections 216, 216' to be placed closer together or even one atop the other and separated by a nonconductive layer. Conductor 215 may be placed on the opposite side of resonator layer 150 from electrode 157 to obviate having transmission line 210 and conductor 215 crossing each other. Alternatively, conductor 215 may be laid out as a closed geometric figure (e.g., square, oval etc., with a circle being preferred) with interconnections 216, 216' being attached at opposing sides of the closed geometric figure. In this embodiment, it will be appreciated that it is necessary to make the resistance of the two sides of the figure equal or proportional (if the sites for the interconnections are not symmetrically disposed).

Moreover, in alternative embodiments (not illustrated), conductor 215 (FIGS. 3, 4) may be formed on substrate 110 or may comprise a suitably-doped and shaped region within substrate 110. These embodiments are not as efficient in heating resonator layer 150 but have the advantage of requiring less lithography to be performed on resonator layer 150. Alternatively, conductor 215 may be configured as a single strip along one or more sides of electrode 157. This arrangement simplifies layout etc. but also introduces undesirable temperature gradients within resonator layer 150.

Further, it will be appreciated that either of the welding techniques described may be employed with either of the gas-phase etching processes described for thinning resonator layer 150 or that other bonding or thinning processes may be usefully applied for manufacturing acoustic resonator 15.

Thus, a thermally compensated, high Q acoustic resonator 15 has been described which overcomes specific problems and accomplishes certain advantages relative to prior art methods and mechanisms. The improvements over known technology are significant. The expense, complexities and high weight, size and power requirements of prior art approaches are avoided. Acoustic resonator 15 may be usefully combined to form filters and oscillators that are manufacturable and are robust in operation, and may be combined with monolithic integrated circuitry to provide signal processing modules that are extremely compact.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A method for making a temperature compensated resonator, said method comprising steps of:

providing a substrate including a cavity;

providing a resonator layer including a conductor disposed on said resonator layer, said resonator layer comprising a single-crystal piezoelectric material chosen from a group consisting of lithium niobate and lithium tantalate and having a first thickness in a range of one hundred micrometers to one millimeter; and bonding said resonator layer to said substrate such that said resonator layer is disposed atop said substrate and said cavity, said step of bonding including a step of thinning said resonator layer to a second thickness less than said first thickness by a mechanical polishing technique, and wherein said step of bonding further includes a step of thinning said resonator layer to a third thickness less than said second thickness via a gas-phase etching process, and wherein said conductor is for heating said resonator layer during operation of said temperature compensated resonator in response to a current passing through said conductor.

2. A method for making a temperature compensated resonator as claimed in claim 1, wherein said step of providing a substrate including a cavity includes a step of providing a semiconductor substrate.

3. A method for making a temperature compensated resonator as claimed in claim 1, wherein said step of bonding further includes steps of:

depositing a metal film on said resonator layer; and welding said resonator layer to said substrate by resistance heating of said metal film.

4. A method for making a temperature compensated resonator as claimed in claim 1, wherein said step of bonding further includes steps of:

depositing a metal film on said resonator layer; and welding said resonator layer to said substrate by ultrasonic thermocompression welding said metal film.

5. A method for making a temperature compensated resonator as claimed in claim 1, wherein said step of bonding further includes a step of thinning said resonator layer to a third thickness less than twelve micrometers.

* * * * *